United States Patent [19]
Rufray
[11] 4,223,235
[45] Sep. 16, 1980

[54] ELECTRONIC SWITCHING CIRCUIT

[75] Inventor: Jean-Claude Rufray, Paris, France
[73] Assignee: Thomson-CSF, Paris, France

[21] Appl. No.: 941,577
[22] Filed: Sep. 12, 1978
[30] Foreign Application Priority Data
Sep. 16, 1977 [FR] France ............ 77 28070
[51] Int. Cl.[3] ............ H03K 17/56
[52] U.S. Cl. ............ 307/241; 307/243; 307/255; 307/315; 328/104
[58] Field of Search ............ 307/241, 243, 254, 255, 307/221 R; 340/173 R

[56] References Cited
U.S. PATENT DOCUMENTS 3,611,288 11/1971 Brown ............ 307/243
3,673,501 6/1972 Zeph ............ 307/221 R
3,965,459 6/1976 Spencer et al. ............ 307/243

*Primary Examiner*—Stanley D. Miller, Jr.
*Assistant Examiner*—B. P. Davis
*Attorney, Agent, or Firm*—Cushman, Darby & Cushman

[57] ABSTRACT

An electronic switching circuit for switching electrical signals from several channels towards one channel or vice versa. For switching an electrical signal selected from others, the invention provides on the one hand a switching device comprising switching semiconductors and directional semiconductors and an impedance matcher and, on the other hand, a control stage of which the organization is such that the co-operation of a voltage generator with a shunt ensures an automatic order of priority among the signals to be switched.

16 Claims, 5 Drawing Figures

ELECTRONIC SWITCHING CIRCUIT

This invention relates to switching circuits and, more particularly, to electronic circuits of the type in which an a.c. or d.c. voltage signal is selected from other signals at the input end of the arrangement to be directed towards an output channel.

In the most common case where the arrangement comprises several input channels and/or several output channels, the transfer of an electrical signal from an input channel to an output channel is based on the use of a means for switching the channel selected and, simultaneously, from blocking the other channels, this switching means being in turn controlled by directional means under the action of signals applied to control inputs.

Switching arrangements have to be adapted to a wide range of electronic circuits connected to the inputs and outputs. In particular, they have to be designed for or adaptable to a wide dynamic range of the signals on the input channels, i.e. to wide voltage ranges, and to certain characteristics of the circuits connected to their output, such as their impedance for example. This is why improved switching arrangements frequently comprise matching means at their inputs or outputs.

In addition, these matching means may with advantage be designed in such a way that the switching from one channel to another does not produce any variation in the level of the output signal. An over-rapid variation, similar to a parasitic signal, frequently gives rise to processing problems, particularly if the connected circuits have high amplification gains.

Finally, it is often desirable, depending on the prupose for which it is used, for the switching arrangement to comprise additional means for establishing a predetermined order of priority between the various input signals.

Conventional switching arrangements are extremely numerous and belong essentially to two groups, namely mechanical or electrical.

Mechanical switching arrangements, which comprise contacts movable in relation to other fixed contacts, such as for example channel selectors, push-button keyboards, matrixes of connecting pins, have only one advantage: the electrical contacts which they use provide for a certain power in the current intensity. On the other hand, they are slow; they do not process the signals whith they receive and transmit them without matching; they are the source of parasitic signals when a moving contact changes position between two fixed conacts; the priority organisations are virtually impossible to establish; finally, the very fact that the arrangement is mechanical means that it is more bulky and more expensive than other arrangements designed in accordance with more recent techniques.

In electronic switching arrangements, the mechanical contacts are replaced by semiconductors; the switched currents may be strong where the semiconductors are so-called power elements or weak where the semiconductors are for example the field-effect transistors of a multiplexer. Those which do not respond to a manual control input may be very rapid. There are switching arrangements which are sensitive to a frequency range of, for example, from 50 Hz to 50,000 Hz. In addition, they may be automatically switched, depending on the frequency of the signals, towards an output corresponding to a clearly defined frequency range. Some of them comprise additional circuits to counteract the appearance of parasitic switching signals or even to establish a particular order of priority of switching, but they are normally very complicated and, hence, very expensive.

The switching arrangement according to the present invention does not have any of these disadvantages. Despite reduced production costs, it ensures in particular:

the constancy of the level of the d.c. output signals;

a high dynamic ratio of the input signals;

a predetermined order of priority.

In addition, it ensures:

control by positive or negative signals;

the reversibility of the arrangement of which the layout remains valid for switching either a plurality of input signals towards an output or an input signal towards a plurality of outputs.

The switching circuit according to the invention is applicable in particular to the switching of signals in audio-frequency applications, such as audiovisual equipment or telophony, to measuring apparatus or to signal sampling systems.

One embodiment which is distinguished in particular by its compactness and its reduced production costs, is known by the name of monolithic integration.

The present invention relates to an electronic switching circuit comprising a plurality of input and output channels and a plurality of control channels, these control channels acting on an arrangement of which the outputs are connected on the one hand to the semiconductors responsible for directing the switching elements and, on the other hand, to a logic organisation (prioritizing) stage, said switching circuit being characterised in that its logic organisation ensures an order of priority among the channels to be switched, switching in said order of priority being automatic and independent of the shape and frequency of the signals to be switched.

The present invention will be better understood from the following description in conjunction with the accompanying drawings, wherein:

FIG. 1 shows the layout of the switching circuit. It has already been pointed out that this switching arrangement is suitable for numerous cases of inputs and outputs and that it operates by means of semiconductors.

Figure 1:
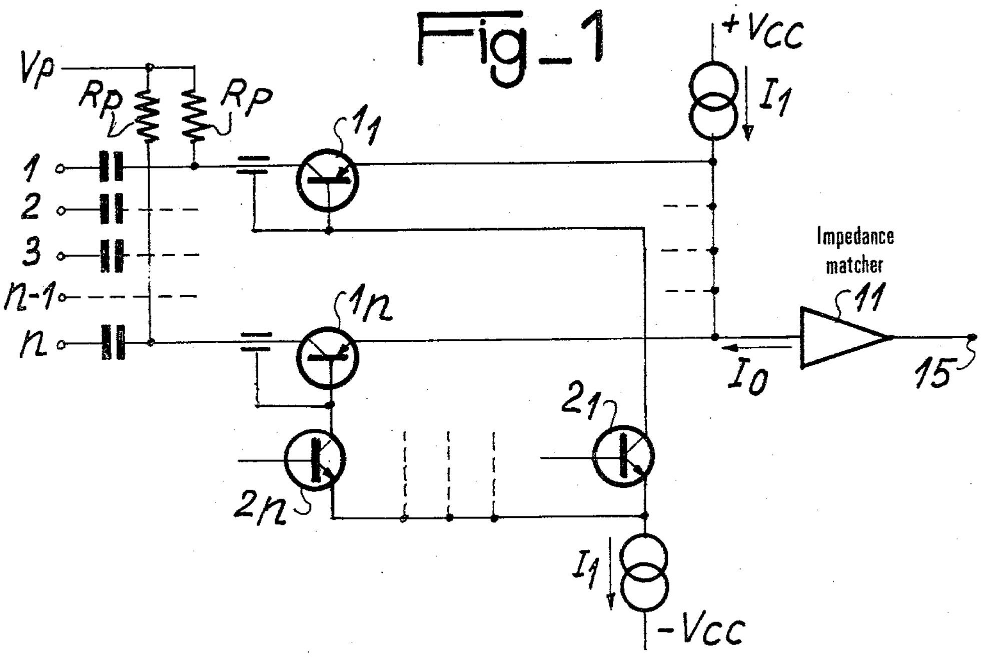
FIG. 1 is a basic circuit diagram of the switching arrangement without the logic priority circuit.

However, the following description will be confined to the case where several input channels are switched towards an output channel, the semiconductors being transistors.

The so-called switching transistors $\mathbf{1}_1$ to $\mathbf{1}_n$ are fed by two current generators generating equal currents of opposite polarity $I_1^+$ and $I_1^-$, of which one is connected to the base and the other to the emitter. The base current of each of the switching transistors is controlled by a so-called directional transistor $\mathbf{2}_1$ to $\mathbf{2}_n$ which itself receives at its base the signal coming from one of the control inputs. Each of the "n" channel inputs is connected to the collector of a switching transistor by a coupling capacitor and is biassed through a resistor $R_P$ fed by a biassing voltage $V_P$. The emitters of all the switching transistors $1_1$ to $1_n$ are coupled with one another and connected to the input of an impedance matcher 11 formed by a differential amplifier having a gain of one and a high input impedance, of which the output 15 additionally forms the output of the switching arrangement.

The switching transistors may be of a conventional type. However, the performance characteristics of the arrangement are greatly improved if these switching transistors, of the PNP type, comprise around the collector diffusion zone an additional P-type zone connected to the base. This additional zone acts as a second connector which controls the current injected by the emitter into the substrate. By eliminating the parasitic currents in the substrate, this type of transistor has the advantage of ensuring symmetry among the channels of the arrangement, the switching transistors all having identical characteristics because the uncontrollable parasitic currents are eliminated.

The switching circuit operates as follows: with the currents $I_1{+}$ and $I_1{-}$, equal but opposite in polarity, respectively applied to the emitters and to the bases of the switching transistors 1, the biassing resistors $R_P$ are not traversed by any current because the switching transistors are blocked. If the impedance matcher 11, of which the input current is $I_o$, is kept connected to the emitters of the transistors 1, the resistors $R_P$ are traversed by a current $I_o$ and the input voltage of the impedance matcher is:

$$V_E = V_P \pm R_P I_o \text{ (depending on the direction of } I_o\text{)}$$

and its output voltage $$V_S = V_P \pm R_P I_o - V_{CE\,sat.}$$

$V_{CE\,sat.}$ being the collector-emitter saturation voltage of the switching transistors for a collector current $I_o$.

Thus, during switching, the d.c. voltage drop between an input and the output of the switching circuit is limited to the saturation voltage $V_{CE\,sat.}$ of the corresponding switching transistor and the d.c. voltage difference between the channels for identical input signals is due solely to the dispersion of the saturation voltages $V_{CE\,sat.}$ of the switching transistors. Since the current $I_o$ is of the order of a few tens of nanoamperes, the difference between the voltages $V_{CE\,sat.}$ is less than one millivolt.

In cases where the currents $+I_1$ and $-I_1$ are no longer equal, the operation described above remains the same in principle, but since the currents are no longer equal, it follows that the biassing resistors and the switching transistors are always traversed by a weak current.

This phenomenon has no disadvantages other than the permanent consumption of current.

Figure 2:
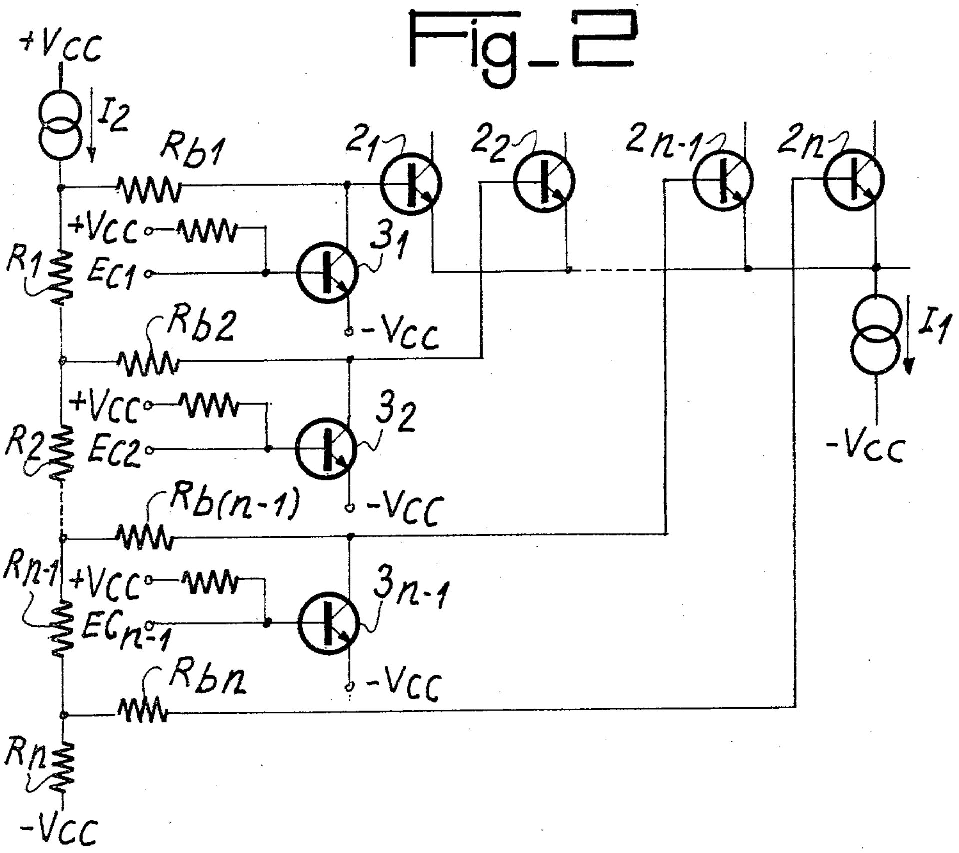
FIG. 2 is a basic circuit diagram of the logic priority circuit.

FIG. 2 shows the diagram of the logic circuit controlling the directional transistors which are the transistors $2_1$ to $2_n$ of FIG. 1.

It is to be understood that the system of priority illustrated in FIG. 2 of the present invention is referred to as a "logic circuit" and "logic organization" because even if control signals are applied to several of the control transistors 3, only one of them will be effective to open a channel. No logic in the sense of digital logic gates (i.e., OR, AND gates) is used.

The collectors of the directional transistors 2 are each connected to the base of a corresponding switching transistor 1 and all their emitters are fed by a current $I_1{-}$.

The bases of the "n" directional transistors 2 are each connected to the collectors of (n−1) control transistors 3 which are themselves fed by a series of resistors $R_1$ to $R_n$ which form a dividing bridge between two voltages $V_{cc+}$ and $V_{cc-}$. It should be noted that, in this arrangement, the directional transistor $2_n$ is not connected to a control transistor, but instead is directly connected to the dividing bridge at its end of lower potential.

At the terminals of each resistor of the dividing bridge there exists a potential difference of the order of 0.4 V to 0.7 V, i.e. corresponding to a voltage $V_{EB}$ such that the corresponding directional transistor 2 is rendered conductive. If, under these conditions, no signal is applied to the control inputs $EC_1$ to $EC_{n-1}$ or if all the control inputs are at a potential which is higher in relation to the voltage $V_{cc-}$ of 0.4 to 0.7 V, i.e. the emitter-base voltage $V_{EB}$ of a transistor 3, all the control transistors $3_1$ to $3_{(n-1)}$ are conductive, blocking the directional transistors $2_1$ to $2_{(n-1)}$. Only the transistor $2_n$, which is not connected to a control transistor, is fed by a voltage extracted at the terminals of the resistor $R_n$: it is conductive and the channel "n" is open.

If one or more control inputs are brought to a voltage $V_{cc-}$, the bases of the corresponding control transistors are blocked and the bases of the directional transistors 2 are brought to decreasing voltages emanating from the bridge formed by the resistors $R_1$ to $R_n$. Since all the emitters of the directional transistors are coupled to one another, only that transistors which has the highest base voltage is rendered conductive. Thus, when one or more control inputs are brought to a voltage $V_{cc-}$, only the channel of lowest index is open.

In the case where the number "n" of channels is high, the voltage at the terminals of the resistance bridge would have to be "n" times 0.4 to 0.7 V, i.e. it could reach a dangerous value for the directional transistors of low index which receive the highest voltages at their bases. An arrangement of transistors which will be described hereinafter enables the resistances of the bridge and the control transistors corresponding to the channels of higher index than the channel selected to be simultaneously shunted.

Figure 3:
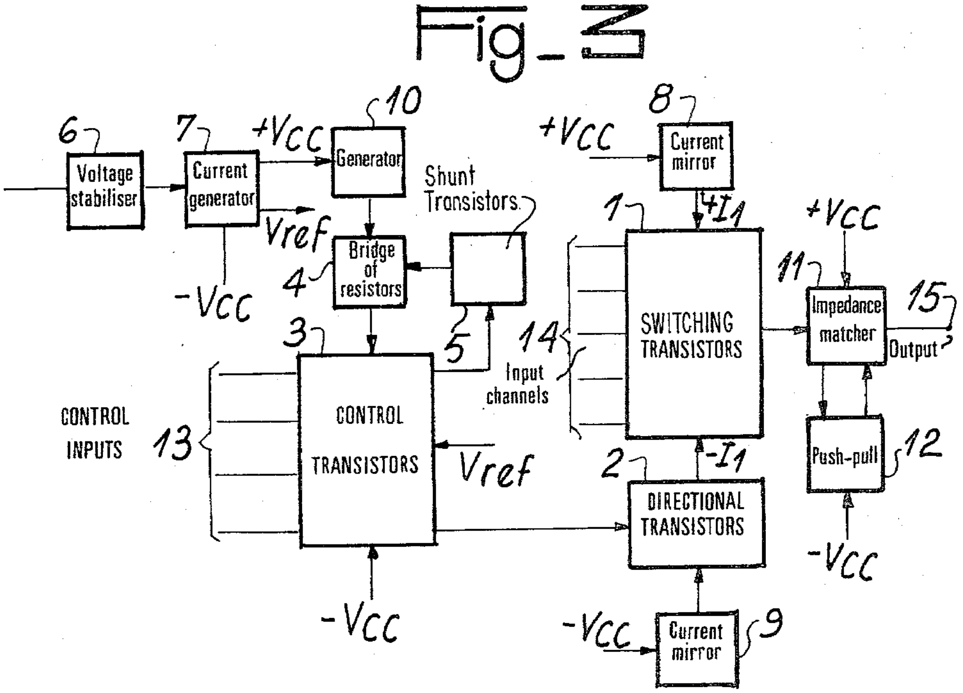
FIG. 3 shows the layout of the complete switching arrangement in the form of a functional block diagram.

FIG. 3 is a diagram, in the form of functional blocks, of the switching circuit according to the invention. A control input 13 acts on the corresponding control transistor 3 which itself acts on the corresponding directional transistor 2 which in turn renders conductive the switching transistor 1 with which it is associated, thus selecting from the input channels 14 that input channel which is selected to be directed towards the matcher 11 and the output 15. The output matcher 11, associated with a push-pull circuit 12, provides for a low output impedance. The arrangement as a whole is fed by means of a voltage stabiliser 6 and a current generator 7 which supply on the one hand the voltages $V_{cc+}$ and $V_{cc-}$ and a reference voltage $V_{ref}$ and, on the other hand, the necessary current to three generators 8, 9 and 10. The generators 8 and 9 are connected to act as current mirrors, the generator 8 producing the current $+I_1$, which is applied to the collectors of the switching transistors 1, and the generator 9 producing the current $-I_1$ which is applied to the bases of the switching transistors through the directional transistors 2. The generator 10 supplies the necessary current to the bridge of resistors 4 which itself generates the voltages required to ensure the operation of the priority circuit among the inputs 13. The shunt resistors 5 provide the switching arrangement with a greater input dynamic ratio.

The invention will be better understood from a more detailed diagram of the arrangement.

Figure 4:
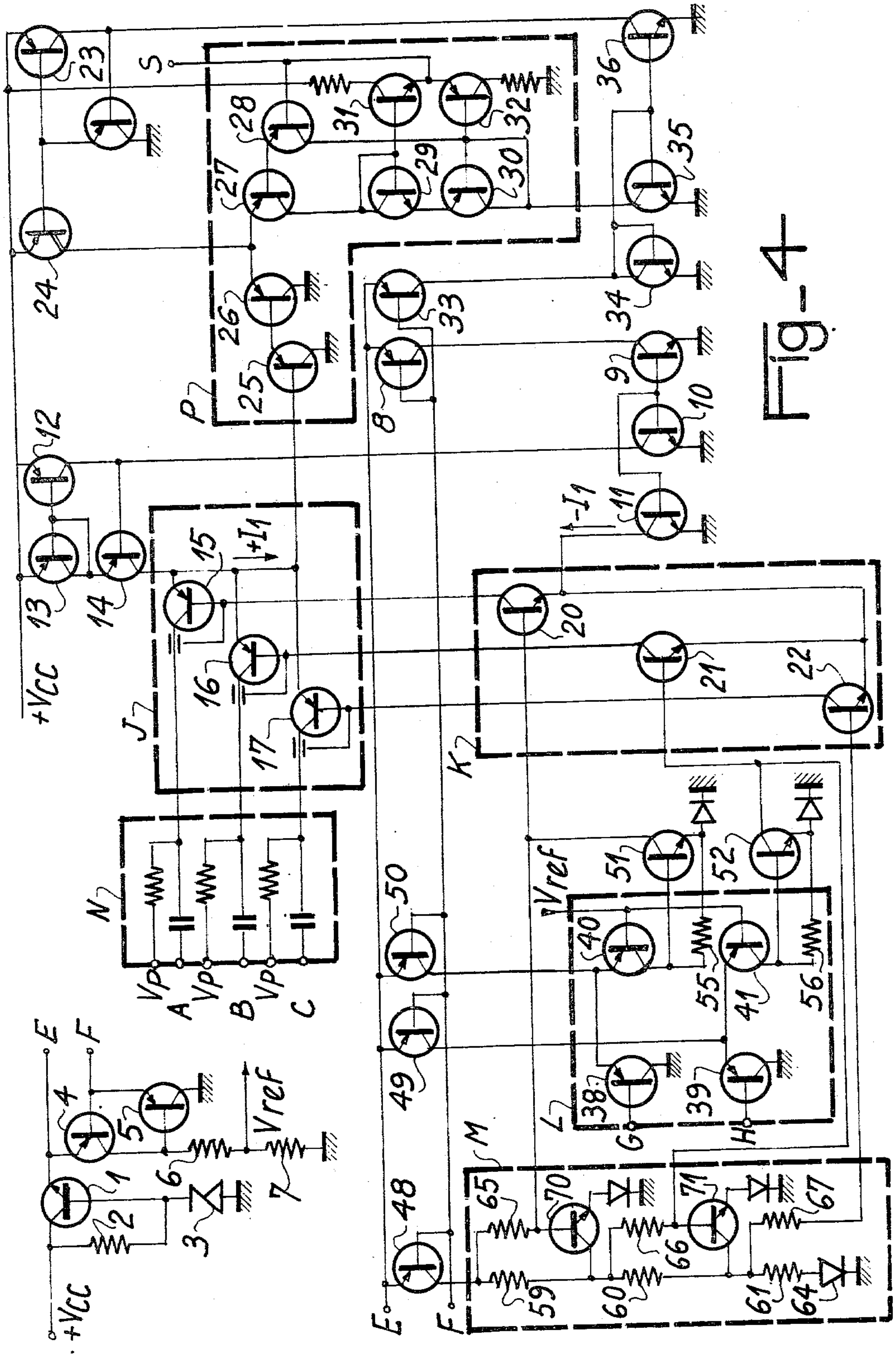
FIG. 4 is a detailed diagram of a circuit for switching several inputs towards an output.

FIG. 4 shows the layout of a switching device according to the invention: in the interests of clarity, the arrangement has been limited to three channel inputs A, B and C two control inputs G and H. However, the diagram is equally valid for "n" channel inputs and "n−1" control inputs.

A transistor 1, a resistor 2 and a Zener diode 3 supply a stabilized voltage feeding the control logic and the current generators.

The principal current generaor is formed by the transistors 4 and 5 and a reference voltage is extracted between the resistors 6 and 7. The principal current is returned by the transistor 8 to the transistor 9 which itself returns the current to the transistors 10 and 11. The transistor 11 supplies a current $-I_1$ which is applied to the emitters of the directional transistors. A "current mirror" formed by the transistors 10, 12 and 13 supplies the transistor 14 with a current $+I_1$ which is equal but opposite in polarity to the current supplied by the transistor 11. The positive current $I_1$ is delivered to the emitters of the switching transistors 15, 16 and 17 (part j of the diagram).

The signals to be switched are applied through capacitors to the channel inputs A, B, C which are biassed by a resistor of high value brought to a biassing potential $V_P$ which may be for example $V_{CC}/2$ (part N of the diagram).

The signal selected passes through the switching transistor by the process described above and is applied to an input of an output matcher which is a follower differential amplifier having a gain of one. This differential amplifier is formed by two circuits of "Darlington" transistors 25+26 and 27+28. The output signal of this differential amplifier at the point S is strengthened by the action of a "push-pull" circuit formed by two transistors 29 and 30 connected as diodes and two complementary transistors 31 and 32 (part P of the circuit).

The differential amplifier and its push-pull are fed by a current coming from the transistor 33: several "current mirrors" reflect the current of the transistors 35 and 36 which itself reflects the current of the transistors 23 and 24. Since the transistor 24 is of the double collector type, the current which it supplies is twice the current passing through the transistor 35. The amplifier is thus balanced because the same intensity passes through the transistor 26 on the one hand and through the transistors 27 and 35 on the other hand.

The transistors 51 and 52 respectively control the bases of the directional transistors 20 and 21. The fact that, in this switching arrangement, there are "n" channel inputs for "n−1" control inputs, provides for permanent operation: thus, if no signal is applied to the control inputs, there is nevertheless always one channel in service. If, in the illustration of FIG. 4, no signal is applied to the control inputs G and H, the transistor 22 is conductive and the channel input C is switched by the transistor 17 (part K of the diagram).

The control transistors are each connected to the control inputs by a differential amplifier. These amplifiers, which are formed by the transistors 38 and 40 and by the transistors 39 and 41, are fed by the generators 49 and 50. One of their bases forms the control input, the other base being brought to a reference potential $V_{ref}$. The output, extracted from the collector of the transistor of which the base is at the potential $V_{ref}$, is applied to the base of the control transistor 51 or 52. This system of control by differential amplifier provides for control by signals having negative or positive levels simply by changing the interconnection (part L of the diagram).

As previously mentioned, the voltages feeding the bases of the directional transistors are obtained by means of a bridge of resistors 59 to 61 fed by the generator 48. These voltates are distributed towards the directional transistors through the base resistors 65 to 67 which, except for the channel which does not comprise a control input, are also the base resistors of the shunt transistors 70 and 71. These shunt transistors are connected in parallel, all their emitters being connected to earth, through a diode, each of the collectors being connected to the common point between two resistors of the dividing bridge (part M of the diagram). When, in this arrangement, a signal is applied to a control input, for example G, the control transistor 51 renders conductive both the directional transistor 20 and the shunt transistor 70. Thus, the transistor 70 shunts the entire part of the resistance bridge corresponding to the control inputs of higher index, which automatically ensures a priority among the inputs.

This same arrangement of shunt transistors provides the invention with another advantage in that it considerably increases the dynamic ratio of the input channels, i.e. the range of voltages admisible at the inputs. This is because, when a channel is switched in the absence of shunt transistors, the base of the directional transistor is at a high voltage equal to the sum of the voltages at the terminals of the resistors of the dividing bridge: this voltage is higher, the greater the number of channels to be switched. For the directional transistor, its collector voltage cannot fall below its base voltage, a fortiori the voltage of the corresponding input, the same reasoning being valid for the switching transistor. Under these conditions, the range of voltages admissible at the channel inputs is more limited and confined to high voltages, the greater the number of channels to be switched. One improvement consists in subordinating the voltage of the base of the switching transistor selected to a fixed voltage which is the same for all the inputs. This fixed voltage is the sum of the base/emitter voltages of the control and directional transistors. The shunt transistors, which are controlled at the same time as the directional transistors, provided for a very wide dynamic range because the voltages at the inputs, irrespective of the index of the input, may be as strong as the feed voltage minus 4 emitter/base voltages.

The arrangement according to the invention which, in the interests of convenience, has been described with reference to the case where one channel input out of three is switched toward an output, also functions in other configurations, such as for example an input towards several outputs. In that case, the layout remains the same: if necessary, it requires as many impedance matchers as there are outputs.

Figure 5:
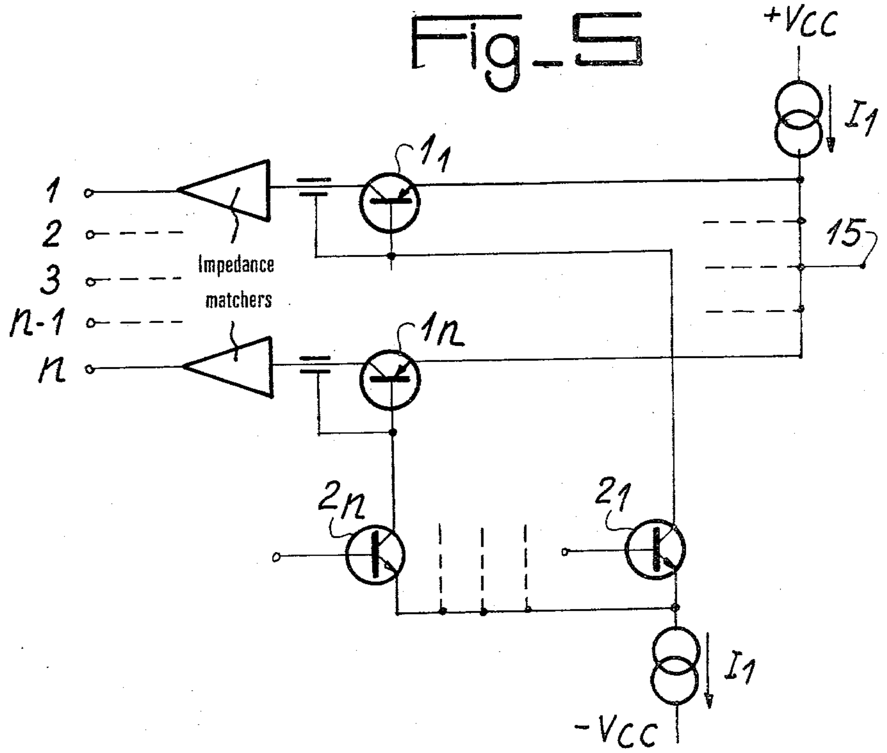
FIG. 5 shows the modification to be made to the circuit diagram of FIG. 1 in the case where the arrangement switches an input towards several outputs.

FIG. 5 shows the switching part of the apparatus in the case where an input is switched towards one of several outputs. It is clear that FIG. 5 is symmetrical with FIG. 1 so far as the inputs and outputs are concerned: an input 15 is switched toward one of the outputs 1 to "n".

What is claimed is:

1. An electronic switching circuit for controllably transferring signals between a plurality of switched terminals and a pole terminal, said electronic switching circuit comprising:

a plurality of switching transistors, each switching transistor coupling an associated one of said switched terminals with said pole terminal, for controllably transferring a signal between an associated switched terminal and said pole terminal;

a plurality of directional transistors, each coupled to an associated one of said switching transistors, for controlling the switching of said associated switching transistors;

first and second current sources, said first current source coupled to each of said switching transistors and said second current source coupled to each of said directional transistors, said first and second current sources for providing a constant current to a switching transistor, the conductance states of said directional transistors determining which one of said switching transistors receives said constant current;

a plurality of control transistors, each of said control transistors being coupled to an associated one of said directional transistors for controlling the conductance state of an associated directional transistor;

a plurality of control terminals, each of said control terminals being coupled to an associated one of said control transistors for controlling said electronic switching circuit; and a prioritizing circuit for establishing a priority among said switched terminals, comprising a voltage divider circuit having a plurality of voltage nodes, each of said nodes being coupled to an associated directional transistor, whereby the lowest priority terminal of said switched terminals is switched to said pole terminal in the absence of signals at any of said control terminals, and the order of priority among the switched terminals other than said lowest priority terminal is determined in accordance with the connection of said control transistors to respective associated nodes.

2. An electronic switching circuit as in claim 1, wherein the number of said control terminals is less than the number of said switched terminals by one, said lowest priority terminal being unassociated with any of said control transistors and said control terminals; said electronic switching circuit further comprising a plurality of shunt transistors, each being associated with a respective one of said control terminals and coupled to the control transistors associated therewith for shunting to ground the node having the next lowest priority relative to the node connected to said associated control transistor.

3. An electronic switching circuit as in claim 2 wherein said prioritizing circuit further comprises a plurality of signal amplifiers, each being associated with a respective one of said control terminals and the control transistor associated therewith and coupled therebetween for accommodating control signals.

4. An electronic switching circuit as in claim 3 wherein said switched terminals are input terminals and said pole terminal is an output terminal.

5. An electronic switching circuit as in claim 4 further comprising an impedance matching circuit having the input thereof coupled to each of said switching transistors and the output thereof coupled to said pole terminal.

6. An electronic switching circuit as in claim 5 wherein said shunt transistors improve the capacity of said switched terminals, irrespective of priority, to accommodate signals of a large dynamic ratio applied thereto, said dynamic ratio depending upon the value of supply voltage for said electronic switching circuit reduced by the sum of four base-emitter voltages.

7. An electronic switching circuit as in claim 6 further comprising a plurality of resistors, each coupled between an associated switching transistor and a voltage source, for biasing said switching transistors.

8. An electronic switching circuit as in claim 3 wherein said pole terminal is an input terminal and said switched terminals are output terminals.

9. An electronic switching circuit as in claim 8 further comprising a plurality of impedance circuits, each having the input thereof coupled to an associated one of said switching transistors and the output thereof coupled to an associated one of said switched terminals.

10. An electronic switching circuit as in claim 3 wherein said first and second current sources provide respective currents having equal magnitudes and opposite polarities.

11. An electronic switching circuit as in claim 3 wherein said first and second current sources provided respective currents having unequal magnitudes.

12. An electronic switching circuit as in claim 3 wherein said signal amplifiers are responsive to positive polarity signals applied to said control terminals.

13. The electronic switching circuit as in claim 3 wherein said signal amplifiers are responsive to negative polarity signals applied to said control terminals.

14. The electronic switching circuit as in claim 3 wherein each of said switching transistors is of a type having an additional zone around the collector diffusion zone, said additional zone being connected to the base, for controlling the current injected by the emitter into the substrate.

15. An electronic switching circuit for controllably transferring signals between a plurality of switched terminals and a pole terminal, said electronic switching circuit including a plurality of control terminals, each associated with a respective one of said switched terminals and being one less in number than the number of said switched terminals; said switching circuit comprising:

means for controllably switching a signal path between said pole terminal and a switched terminal;

means for controllably passing a constant current through said switching means to obtain said signal path;

means for providing a priority organization to said switched terminals, including a voltage divider provided with voltage gradients at the nodes thereof, said priority organization being dependent therefrom; and means responsive to said voltage gradients for selectively activating said constant current passing means in response to signals applied to said control terminals, wherein said signal path is switched between said pole terminal and the highest priority switched terminal associated with a control terminal to which a signal is applied, said signal path being switched between said pole terminal and the lowest priority switched terminal in the absence of signals being applied to any of said control terminals.

16. The switching circuit as in claim 15 wherein said priority organization means further includes means for shunting nodes of a lower priority than the node associated with the highest priority switched terminal associated with a control terminal to which a signal is applied to accommodate a high dynamic ratio of signals to be switched.

* * * * *